US012806802B2

(12) United States Patent
Lai et al.

(10) Patent No.: US 12,806,802 B2
(45) Date of Patent: Nov. 24, 2026

(54) ROBOTIC ARM CAPABLE OF PICKING AND PLACING MULTI-SIZE WAFERS

(71) Applicant: GALLANT MICRO. MACHINING CO., LTD., New Taipei City (TW)

(72) Inventors: Hung-Neng Lai, New Taipei City (TW); Chun-Sung Chuang, New Taipei City (TW); Xin-Hong Ye, New Taipei City (TW)

(73) Assignee: GALLANT MICRO. MACHINING CO., LTD., New Taipei City (TW)

( * ) Notice: Subject to any disclaimer, the term of this patent is extended or adjusted under 35 U.S.C. 154(b) by 1085 days.

(21) Appl. No.: 17/893,217

(22) Filed: Aug. 23, 2022

(65) Prior Publication Data

US 2023/0373105 A1 Nov. 23, 2023

(30) Foreign Application Priority Data

May 18, 2022 (TW) ................................. 111118563

(51) Int. Cl.

| | |
|---|---|
| ***H10P 72/78*** | (2026.01) |
| ***B25J 11/00*** | (2006.01) |
| ***B25J 15/00*** | (2006.01) |
| ***B25J 15/06*** | (2006.01) |
| ***H10P 72/00*** | (2026.01) |
| ***H10P 72/76*** | (2026.01) |
| *B25J 9/00* | (2006.01) |

(52) U.S. Cl.

CPC ....... *B25J 15/0616* (2013.01); *B25J 11/0095* (2013.01); *B25J 15/0028* (2013.01); *H10P 72/0446* (2026.01); *H10P 72/7602* (2026.01); *H10P 72/78* (2026.01); *B25J 9/0087* (2013.01)

(58) Field of Classification Search

CPC .. B25J 9/0087; B25J 11/0095; B25J 15/0028; B25J 15/0616; H01L 21/67144; H01L 21/6838; H01L 21/68707

USPC .......................................................... 294/141

See application file for complete search history.

(56) References Cited

U.S. PATENT DOCUMENTS 6,828,772 B1 * 12/2004 Hofer ................ H01L 21/68707 324/750.19
7,300,082 B2 * 11/2007 Rogers .................. B25J 13/085 414/941
7,648,327 B2 * 1/2010 Bonora ............. H01L 21/67766 414/744.6
8,398,355 B2 * 3/2013 Holtkamp ......... H01L 21/67173 414/217

(Continued)

*Primary Examiner* — Joshua E Rodden
(74) *Attorney, Agent, or Firm* — WPAT, PC

(57) ABSTRACT

A robotic arm capable of picking and placing multi-size wafers includes a first picking and placing unit, a second picking and placing unit and a base. The first picking and placing unit is to transport a first-size or second-size wafer from a first position to a second position. The second picking and placing unit, disposed adjacent to the first picking and placing unit, is to transport the first-size or second-size wafer from the first position to the second position. The base is to construct the first picking and placing unit and the second picking and placing unit. The first picking and placing unit and the second picking and placing unit are identically structured, each of these two units has a frame with adjustable spacing, and thus these two units are able to transport the first-size and second-size wafers simultaneously.

4 Claims, 8 Drawing Sheets

(56) References Cited

U.S. PATENT DOCUMENTS

| | | | | |
|---|---|---|---|---|
| 8,800,774 | B2 * | 8/2014 | Bonora | B65G 65/00 206/832 |
| 8,899,649 | B2 * | 12/2014 | Li | B25J 15/0028 294/902 |
| 9,302,395 | B2 * | 4/2016 | Ando | B25J 11/0095 |
| 9,536,764 | B2 * | 1/2017 | Embertson | H01L 21/67742 |
| 10,607,879 | B2 * | 3/2020 | Cavins | H01L 21/67727 |
| 12,479,085 | B2 * | 11/2025 | Hosek | B25J 9/126 |
| 2003/0035711 | A1 * | 2/2003 | Gilchrist | H01L 21/68707 414/744.8 |
| 2006/0125260 | A1 * | 6/2006 | Chae | B25J 15/026 294/119.1 |
| 2014/0154033 | A1 * | 6/2014 | Blank | B25J 11/0095 414/217 |
| 2015/0008690 | A1 * | 1/2015 | Kobuchi | H01L 21/6838 294/183 |
| 2015/0098790 | A1 * | 4/2015 | Wakabayashi | B25J 11/0095 414/800 |
| 2016/0218030 | A1 * | 7/2016 | Embertson | H01L 21/68707 |
| 2018/0068881 | A1 * | 3/2018 | Cavins | H01L 21/67265 |
| 2018/0104827 | A1 * | 4/2018 | Goto | H01L 21/68707 |
| 2020/0122316 | A1 * | 4/2020 | Tsang | B65G 47/907 |
| 2021/0320028 | A1 * | 10/2021 | Ammerl | B25J 15/0014 |
| 2022/0152839 | A1 * | 5/2022 | Wilkas | B25J 9/0087 |
| 2023/0373105 | A1 * | 11/2023 | Lai | B25J 15/0028 |

* cited by examiner

ROBOTIC ARM CAPABLE OF PICKING AND PLACING MULTI-SIZE WAFERS

CROSS REFERENCE TO RELATED APPLICATION

This application claims the benefits of Taiwan application Serial No. 111118563, filed on May 18, 2022, the disclosures of which are incorporated by references herein in its entirety.

TECHNICAL FIELD

The present disclosure relates in general to a robotic arm, and more particularly to a robotic arm capable of picking and placing multi-size wafers.

BACKGROUND

In manufacturing semiconductors, robotic arms are often used to move wafers from one manufacturing or inspection process to the next process. Currently, the robot arm usually has X and Y axial movement strokes to transport the wafer to the next process, and generally the robot arm has a single-plate pick-and-place plate for picking and placing wafers of a single size.

However, while in picking and placing wafers of different sizes, the pick-and-place plate on the robot arm needs to be removed and replaced with a pick-and-place plate of the corresponding size. In addition to the time-consuming process of replacing the pick-and-place plate, it is also infeasible to pick and place wafers of two sizes simultaneously. As such, efficiency in manufacturing the semiconductors is substantially reduced.

Thus, how to improve and provide a "robot capable of picking and placing multi-size wafers" to avoid the above-mentioned problems is definitely an important issue in the art.

SUMMARY

Accordingly, it is an object of the present disclosure is to provide a robotic arm capable of picking and placing multi-size wafers to resolve these aforesaid problems in the art.

In one aspect of this disclosure, a robotic arm capable of picking and placing multi-size wafers includes a first picking and placing unit, a second picking and placing unit and a base. The first picking and placing unit is configured for transporting a first-size wafer or a second-size wafer from a first position to a second position. The second picking and placing unit, disposed adjacent to the first picking and placing unit, is configured for transporting the first-size wafer or the second-size wafer from the first position to the second position. The base is configured for constructing thereon the first picking and placing unit and the second picking and placing unit. The first picking and placing unit and the second picking and placing unit are identically structured, each of the first picking and placing unit and the second picking and placing unit has a frame with adjustable spacing, and thus the first picking and placing unit and the second picking and placing unit are able to transport the first-size wafer and the second-size wafer simultaneously.

In one embodiment of this disclosure, the first picking and placing unit further includes a first frame, a first drive portion and a first link. The first frame is configured for providing a first spacing and a second spacing to sustain thereon the first-size wafer and the second-size wafer, respectively. The first drive portion is configured for adjusting the first frame to have the first spacing or the second spacing. The first link, connected with the first drive portion, is configured for providing X-axial and Y-axial displacements.

In one embodiment of this disclosure, the first frame is further furnished with an adherence hole for vacuuming the first-size wafer or the second-size wafer.

In one embodiment of this disclosure, the second picking and placing unit further includes a second frame, a second drive portion and a second link. The second frame is configured for providing a first spacing and a second spacing to sustain thereon the first-size wafer and the second-size wafer, respectively. The second drive portion is configured for adjusting the first frame to have the first spacing or the second spacing. The second link, connected with the first drive portion, is configured for providing X-axial and Y-axial displacements.

In one embodiment of this disclosure, the second frame is further furnished with an adherence hole for vacuuming the first-size wafer or the second-size wafer.

In one embodiment of this disclosure, the first picking and placing unit and the second picking and placing unit are vertically arranged in parallel to each other.

In one embodiment of this disclosure, the first picking and placing unit and the second picking and placing unit are horizontally and separately arranged.

In another aspect of this disclosure, a robotic arm capable of picking and placing multi-size wafers includes a picking and placing unit and a base. The picking and placing unit, having a frame with adjustable spacing, is configured for transporting a first-size wafer or a second-size wafer from a first position to a second position. The base is configured for constructing thereon the picking and placing unit.

In one embodiment of this disclosure, the picking and placing unit further includes a frame, a drive portion and a link. The frame is configured for providing a first spacing and a second spacing to sustain thereon the first-size wafer and the second-size wafer, respectively. The drive portion is configured for adjusting the frame to have the first spacing or the second spacing. The link, connected with the drive portion, is configured for providing X-axial and Y-axial displacements.

In one embodiment of this disclosure, the frame is further furnished with an adherence hole for vacuuming the first-size wafer or the second-size wafer.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
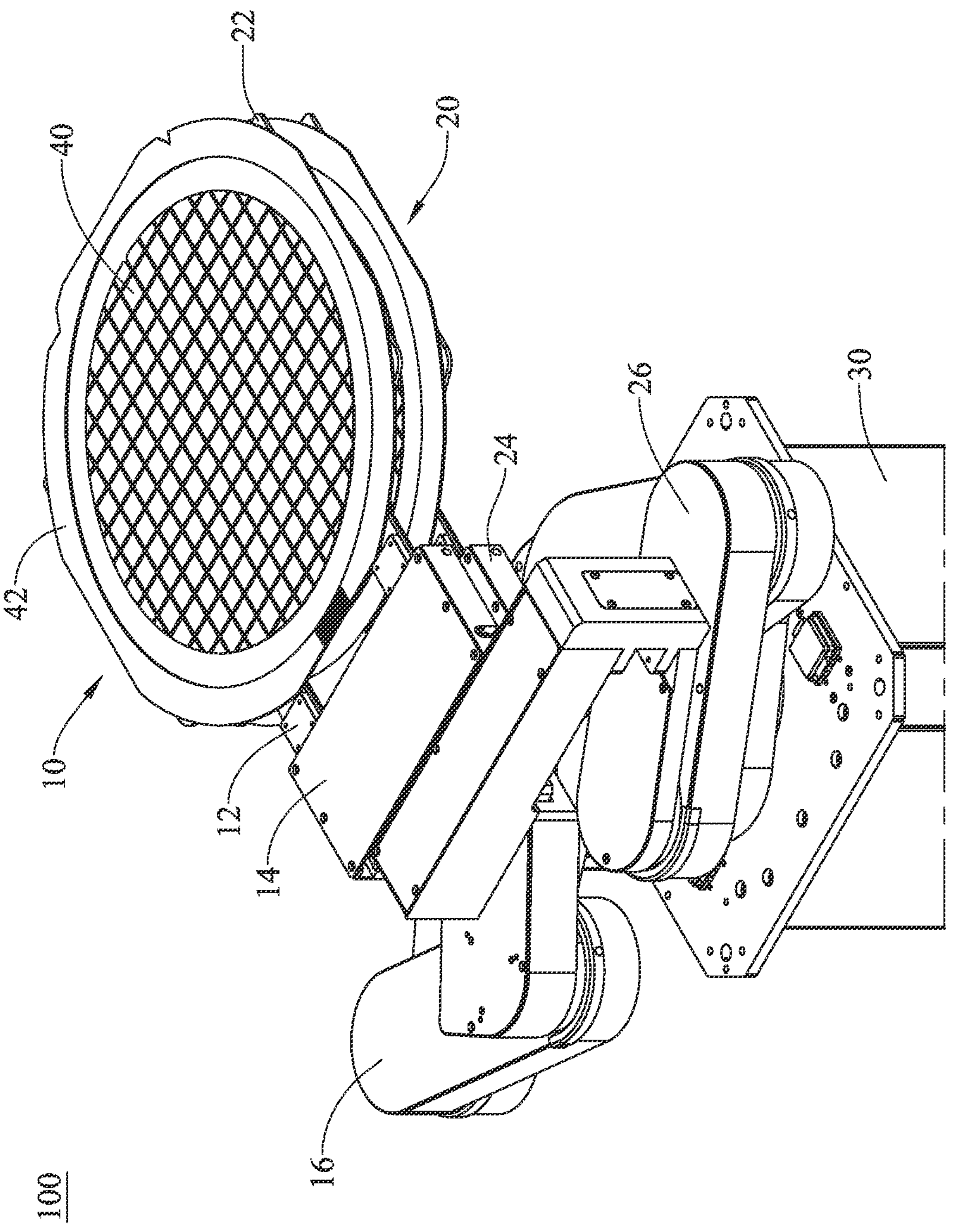
FIG. 1 is a schematic perspective view of an embodiment of the robotic arm capable of picking and placing multi-size wafers in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

For the sake of clarity and convenience in the description of the drawings, various components in the drawings may be shown exaggerated or reduced in size and proportion. In the following description and/or claims, when an element is referred to as being "connected" or "coupled" to another element, it can be directly connected or coupled to the other element, or indirectly connected or coupled to the other element through intervening elements. When "directly connected" or "directly coupled" to another element appears, it implies that no intervening element is present. Such a manner prevails in describing the relationship between elements or layers. In addition, "first", "second", "third" and the like ordinal number in the description present no sequential relationship with each other, and are only used to indicate and distinguish two different elements with the same name. Also, for ease of understanding, the same elements in the following embodiments are denoted by the same symbols.

Referring to FIG. 1, a schematic perspective view of an embodiment of the robotic arm capable of picking and placing multi-size wafers in accordance with this disclosure is shown. In this embodiment, the robotic arm capable of picking and placing multi-size wafers 100 includes a first picking and placing unit 10, a second picking and placing unit 20 and a base 30.

The first picking and placing unit 10 is consisted at least of a first frame 12, a first drive portion 14 and a first link 16. The first picking and placing unit 10 is configured for transporting a wafer 40 of a first size from a first position to a second position. In some other embodiments, the first picking and placing unit 10 may be configured for transporting another wafer 40 of a second size from the first position 10 the second position.

Figure 2A:
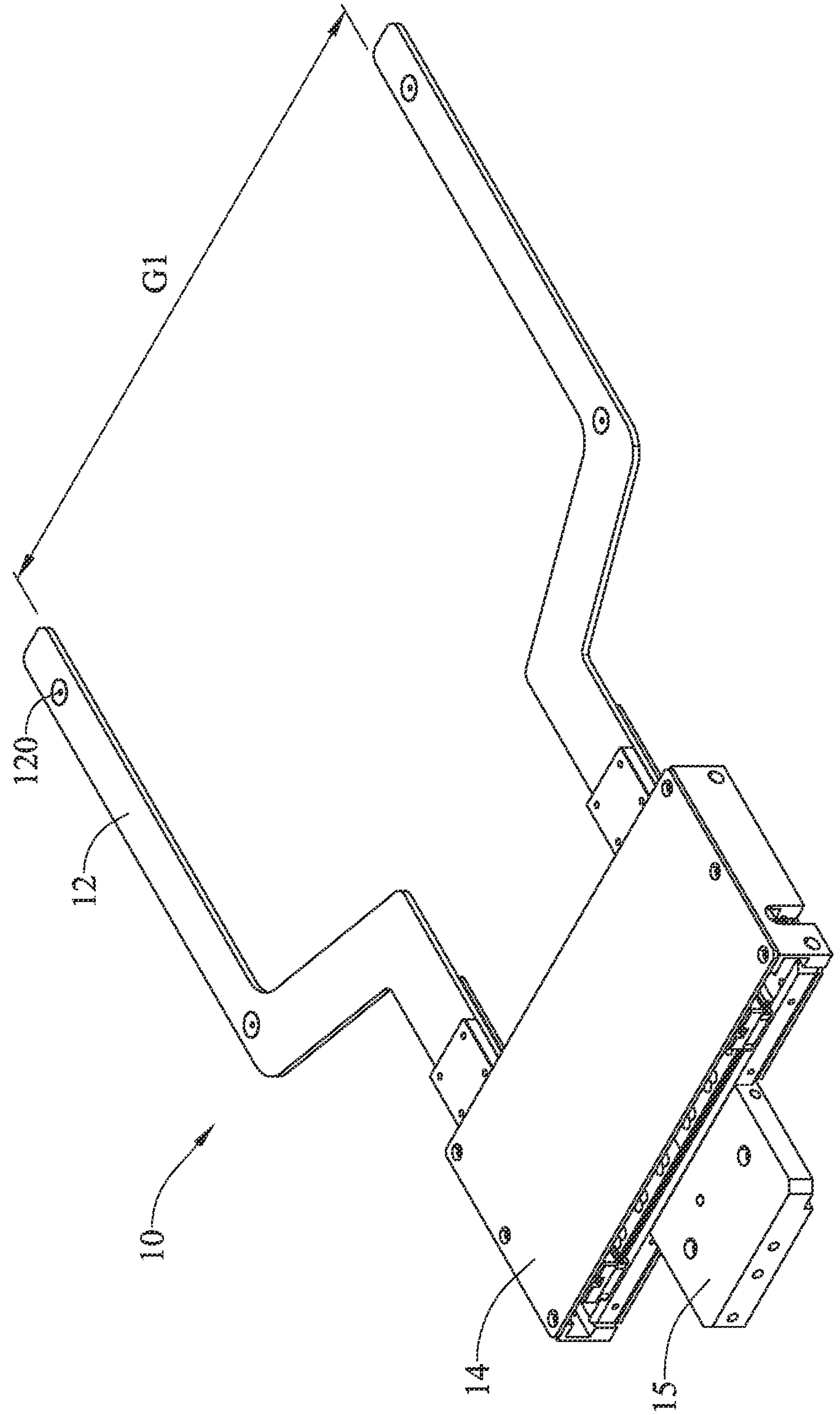
FIG. 2A is a schematic perspective view of the first picking and placing unit of FIG. 1 in a state of first spacing.

The first frame 12 can be structured to be a fork frame, as shown in FIG. 2A. In particular, the first frame 12 can be made of a metal, a plastics or any material that is harmless to the wafer 40 while in contacting, but not limited thereto. The first frame 12 can be adjusted to have a first spacing or a second spacing for sustaining thereon a first-size wafer or a second-size wafer.

The first drive portion 14, connected with the first frame 12, is configured for driving the first frame 12 to adjust the spacing between two fork arms (not labeled in the figure) thereof to the first spacing or the second spacing. The first drive portion 14 can be consisted at least of a motor, a transmission gear set, a belt and a drive circuit.

The first link 16, connected with the first drive portion 14, is configured for providing X-axial and Y-axial displacements, such that the first frame 12 can be moved to a storage position to pick up the wafer 40. Then, the sustained wafer 40 can be transported to a following manufacturing or inspection position. The first link 16 can be made of a metal or a rigid material.

The second picking and placing unit 20, resembled structurally and disposed adjacent to the first picking and placing unit 10, is configured for transporting the wafer 40 of the first size from the first position to the second position. In some other embodiments, the second picking and placing unit 20 can be configured for transporting another wafer 40 of the second size from the first position to the second position.

A second frame 22 of the second picking and placing unit 20 can be structured to be a fork frame, as shown in FIG. 2A. In particular, the second frame 22 can be made of a metal, a plastics or any material that is harmless to the wafer 40 while in contacting, but not limited thereto. The second frame 22 can be adjusted to have the first spacing or the second spacing for sustaining thereon the first-size wafer or the second-size wafer.

A second drive portion 24 of the second picking and placing unit 20, connected with the second frame 22, is configured for driving the second frame 22 to adjust the spacing between two fork arms (not labeled in the figure) thereof to the first spacing or the second spacing. The second drive portion 24 can be consisted at least of a motor, a transmission gear set, a belt and a drive circuit.

A second link 26 of the second picking and placing unit 20, connected with the second drive portion 24, is configured for providing X-axial and Y-axial displacements, such that the second frame 22 can be moved to the storage position to pick up the wafer 40. Then, the sustained wafer 40 can be transported to the following manufacturing or inspection position. The second link 26 can be made of a metal or a rigid material.

The base 30 is configured for constructing thereon the first picking and placing unit 10 and the second picking and placing unit 20. Similarly, the base 30 can be made of a metal or a rigid material. As shown in FIG. 1, the first picking and placing unit 10 and the second picking and placing unit 20 is vertically arranged in parallel to each other. In some other embodiments, the first picking and placing unit 10 and the second picking and placing unit 20 may be horizontally and separately arranged. Also, in some other embodiments, the robotic arm capable of picking and placing multi-size wafers 100 can include more than two aforesaid picking and placing units.

Referring to FIG. 2A, a schematic perspective view of the first picking and placing unit of FIG. 1 in a state of first spacing is shown. In this embodiment, the first frame 12 is connected with the first drive portion 14, the first drive portion 14 is connected with the connection portion 15, and the connection portion 15 is further connected with the first link 16. The first frame 12 of the first picking and placing unit 10, controlled by the first drive portion 14, is roughly to present a fork appearance having the first spacing G1 between the two fork arms. Namely, the first frame 12 is controlled by the first drive portion 14 to undergo a horizontal movement to separate the two fork arms by the first spacing G1. As such, the first frame can be ready to sustain thereon the wafer 40 of the first size.

As shown, the first frame 12 is further furnished thereon with a plurality of adherence holes 120. These adherence holes 120 can be vacuumed to adhere the wafer 40 of the first or second size. Practically, the first frame 12 can be structured to have internal air tunnels. By applying a vacuum source such as a vacuum pump to form a vacuum in these internal air tunnels, the wafer 40 of the first or second size can be sucked and thus fixed on an upper surface of the first frame 12, such that the wafer 40 can be away from accidental dropping during transportation. Thereupon, the risk in dropping the wafer during transportation can be substantially reduced.

Figure 2B:
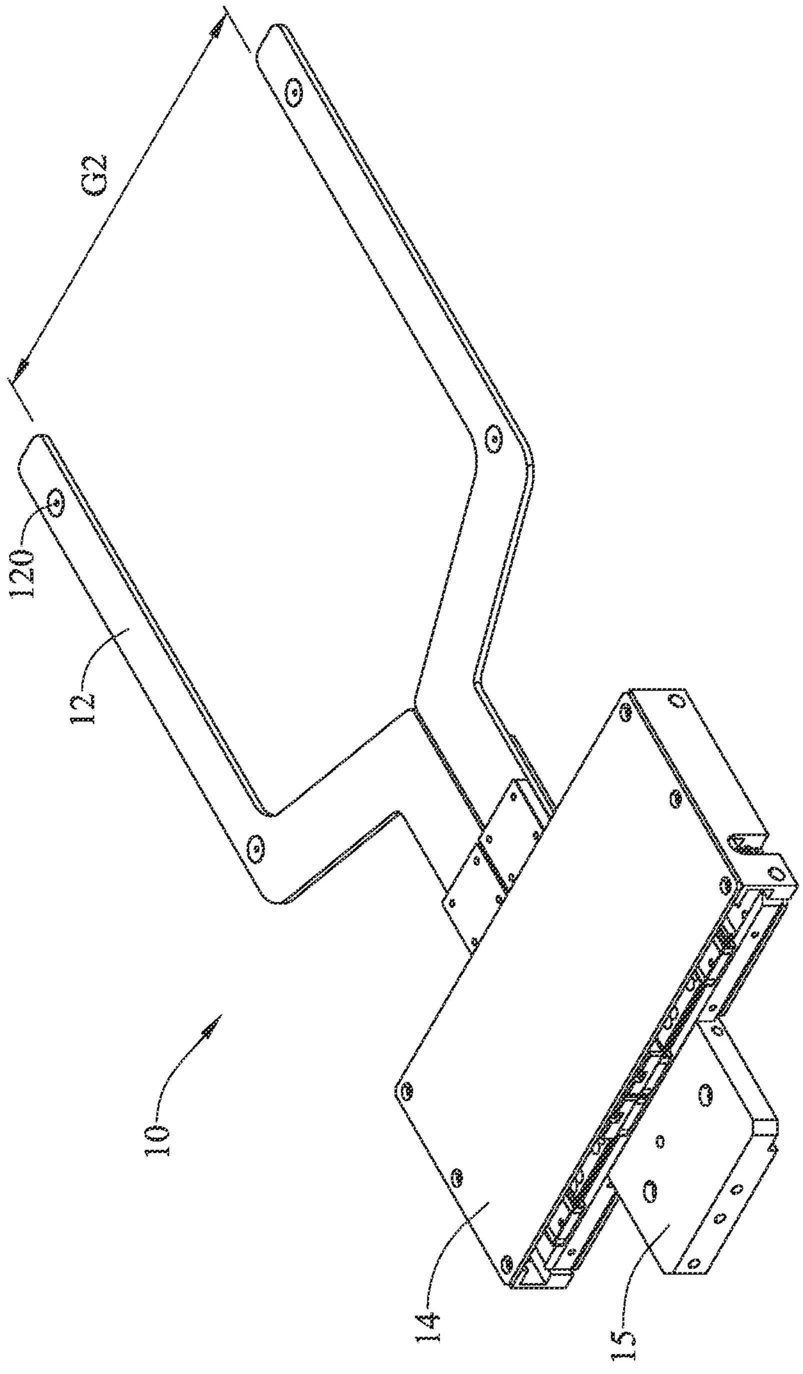
FIG. 2B is a schematic perspective view of the first picking and placing unit of FIG. 1 in a state of second spacing.

Referring to FIG. 2B, a schematic perspective view of the first picking and placing unit of FIG. 1 in a state of second spacing is shown. In this state, the first frame 12 of the first picking and placing unit 10, controlled by the first drive portion 14, is roughly to present a fork appearance having the second spacing G2 between the two fork arms. Namely, the first frame 12 is controlled by the first drive portion 14 to undergo a horizontal movement to approach the two fork arms by holding the second spacing G2. As such, the first frame can be ready to sustain thereon the wafer 40 of the second size. In addition, the spacing between the two fork arms of the first frame 12 can be arbitrarily adjusted by the first drive portion 14, stepwise or continuously, to provide any appropriate gap for sustaining and transporting a wafer with a specific dimension.

Figure 3:
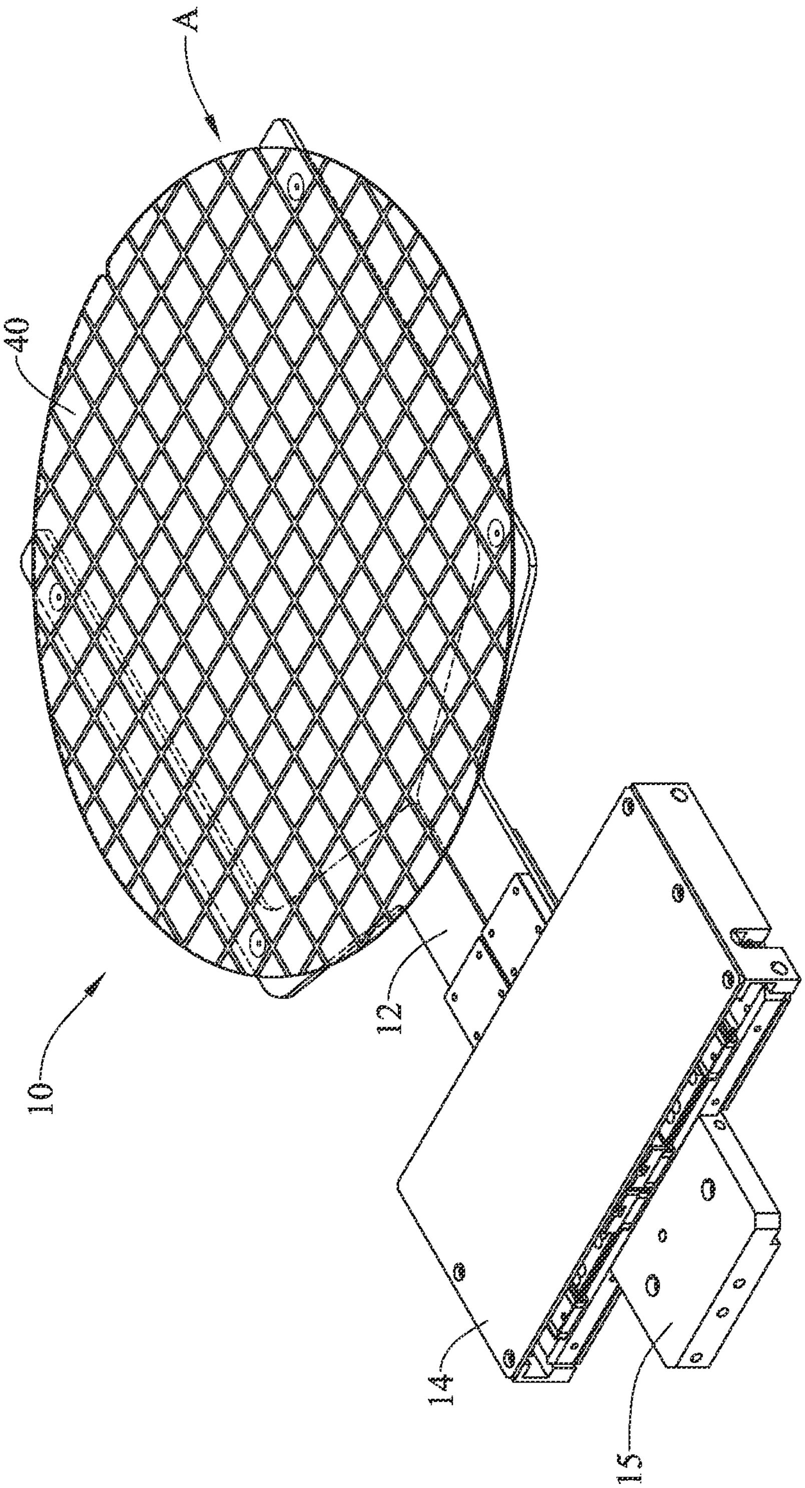
FIG. 3 is a schematic perspective view showing a wafer sustained by the first picking and placing unit of FIG. 2B.

Referring to FIG. 3, a schematic perspective view showing a wafer sustained by the first picking and placing unit of FIG. 2B is shown. In this state, the two fork arms of the first frame 12 are adjusted to have the second spacing G2 to sustain thereon the wafer 40 of the first size. Free ends of the two fork arms of the first frame 12 are protruded out of the wafer 40. Preferably, step structures (not labeled in the figure) are provided to the fork arms at the ends close to the first drive portion 14 for providing more contact and forcing areas for the first frame 12 to securely sustain thereon the wafer 40.

Figure 4:
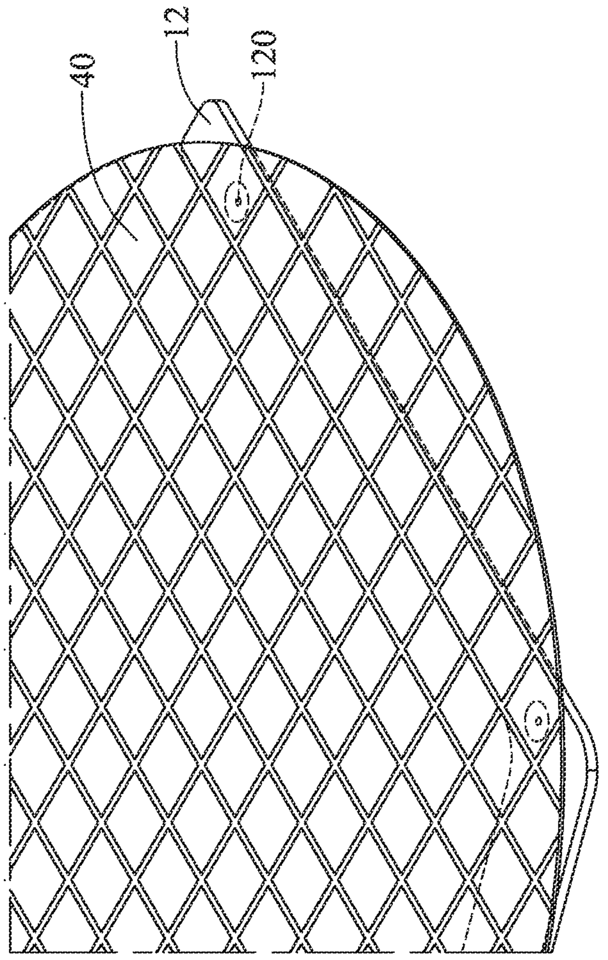
FIG. 4 is a schematic enlarged view of portion A of FIG. 3.

FIG. 4 is a schematic enlarged view of portion A of FIG. 3. As shown, the adherence holes 120 of the first frame 1 would be located under and thus contact a lower surface of the wafer 40. Through vacuuming at these adherence holes 120, the wafer 40 can be firmly sustained. In this disclosure, shapes, locations and quantities of the adherence holes 120 can be arbitrarily arranged, but per practical requirements.

Figure 5:
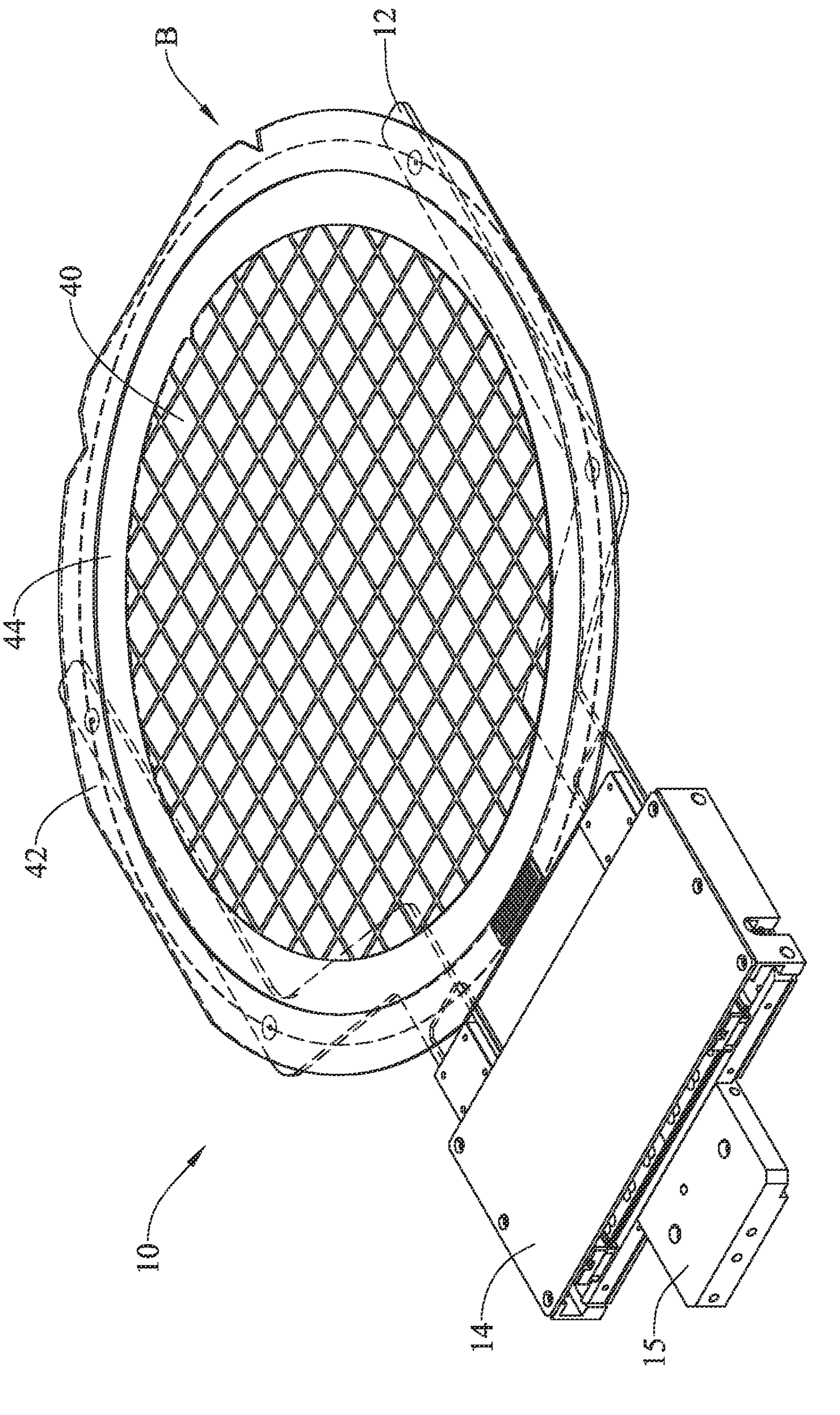
FIG. 5 is a schematic perspective view showing a wafer with a frame sustained by the first picking and placing unit of FIG. 2A.

Referring to FIG. 5, a schematic perspective view showing a wafer with a frame sustained by the first picking and placing unit of FIG. 2A is shown. In this embodiment, the two fork arms of the first frame 12 are adjusted to have the first spacing G1 for sustaining the first-size wafer 40. In FIG. 5, the wafer 40 has a frame 42 and a film 44. Both the frame 42 and the film 44 are configured for fixing and protecting the wafer 40. The frame 42, shaped as a ring, is featured in smoothness, high hardness, anti-bending, anti-corrosion and scratch-proof. The frame 42 can be made of a stainless steel. The film 44, expandable and adhesive, can be a blue membrane or a UV film, but not limited thereto.

Free ends of the two fork arms of the first frame 12 are protruded out of the frame 42. Preferably, step structures (not labeled in the figure) are provided to the fork arms at the ends close to the first drive portion 14 for providing more contact and forcing areas for the first frame 12 to securely sustain thereon the frame 42 and the film 44.

Figure 6:
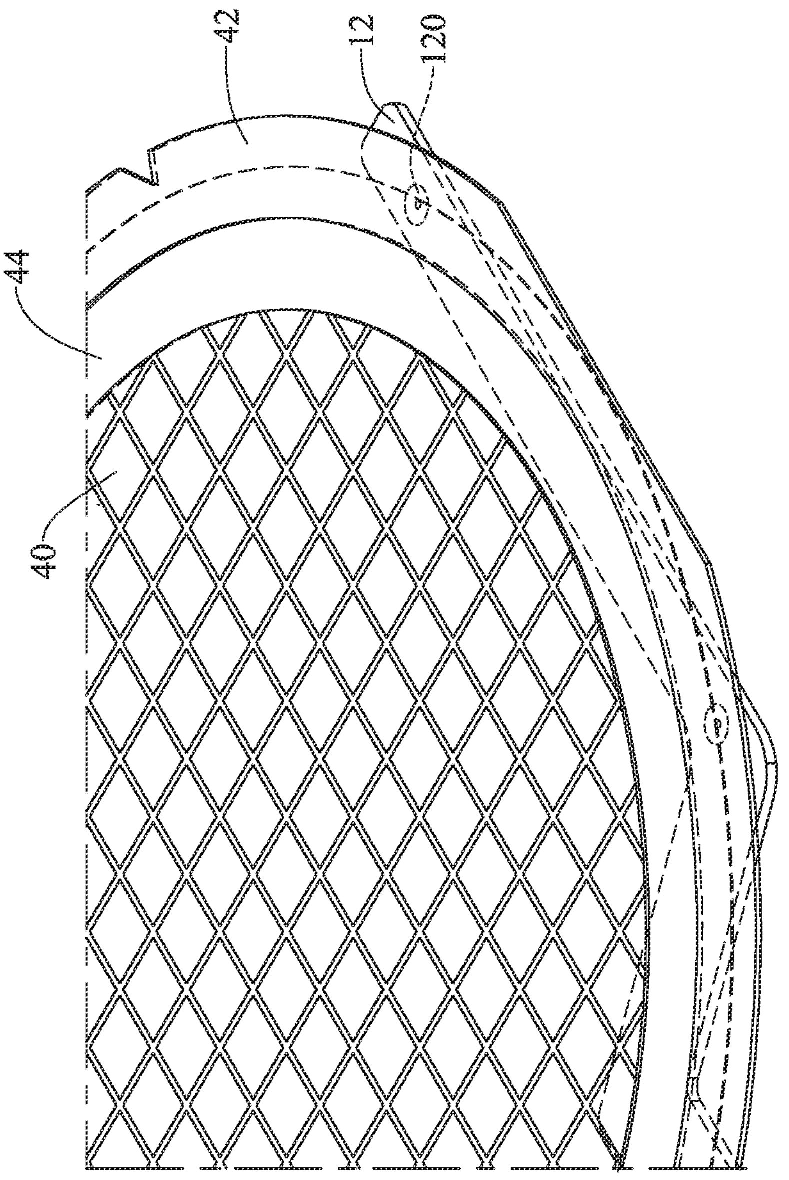
FIG. 6 is a schematic enlarged view of portion B of FIG. 5.

FIG. 6 is a schematic enlarged view of portion B of FIG. 5. As shown, a plurality of adherence holes 120 are provided to the first frame 12. These adherence holes 120 are to contact lower surfaces of the film 44 and/or the frame 42. Through vacuuming at these adherence holes 120, the film 44 and/or the frame 42 can be firmly sustained. In this disclosure, shapes, locations and quantities of the adherence holes 120 can be arbitrarily arranged, but per practical requirements.

Figure 7:
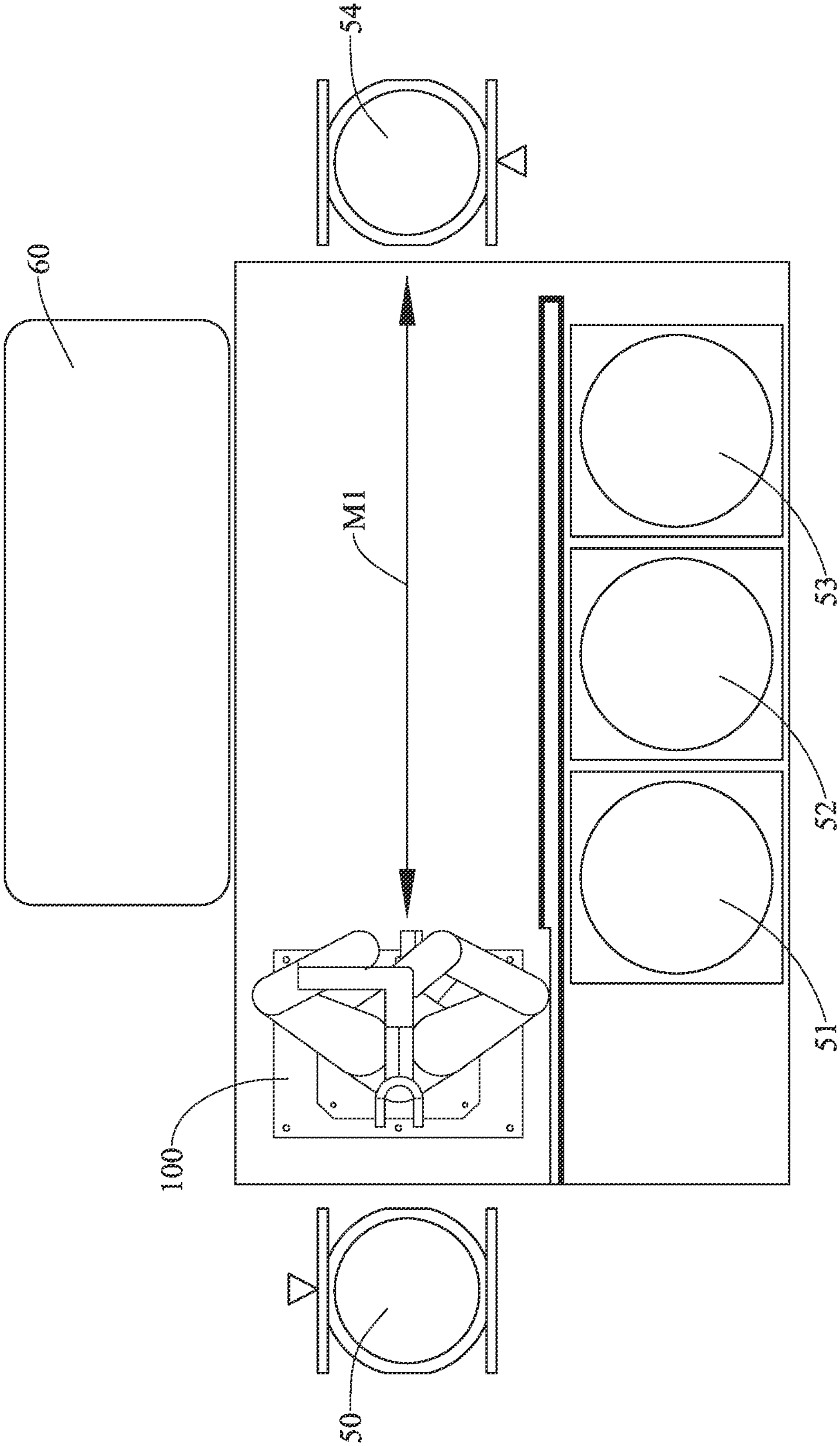
FIG. 7 shows schematically the robotic arm of FIG. 1 to work with wafers of different sizes.

Referring to FIG. 7, the robotic arm of FIG. 1 to work with wafers of different sizes are schematically shown. In this example, the robotic arm 100 are surrounded by a first-size wafer with frame 50, a second-size wafer 51, a third-size wafer 52, a fourth-size wafer 53, a fifth-size wafer with frame 54 and a work station 60.

The robotic arm 100 is moved back and forth within a displacement stroke M1. In this arrangement, the arm 100 of this disclosure is to perform transportations of the first-size wafer with frame 50, the second-size wafer 51, the third-size wafer 52, the fourth-size wafer 53 and the fifth-size wafer with frame 54 with respect to the work station 60.

For example, while in transporting the second-size wafer 51 and the third-size wafer 52, the conventional single-plate robotic arm can transport the second-size wafer 51 and the third-size wafer 52 orderly to the work station 60, and relevant plate trays shall be applied each time to transport the second-size wafer 51 and the third-size wafer 52. On the other hand, since the robotic arm capable of picking and placing multi-size wafers 100 provided in this disclosure is furnished simultaneously with the first picking and placing unit 10 and the second picking and placing unit 20, with the adjustable first frame 12 and second frame 22, respectively, thus the second-size wafer 51 and the third-size wafer 52 can be transported simultaneously. In addition, through adjusting the first frame 12 of the first picking and placing unit 10 and the second frame 22 of the second picking and placing unit 20 to have the same spacing, two said second-size wafers 51 can be transported simultaneously to or from the work station 60. In particular, while in transporting two wafers of the same size, one of the units 10, 20 may be used to pick up the finished wafer from the work station 60, and another unit may be used to sustain the wafer to be uploaded into the work station 60. Thereupon, different-size or identical-size wafers can be transported at the same time, and thus efficiency in transporting wafers can be significantly enhanced.

In summary, in the robotic arm capable of picking and placing multi-size wafers of this disclosure, the spacing of the frame is adjustable to meet wafers of different sizes, and thus the efficiency of wafer transportation can be remarkably enhanced.

In addition, in one embodiment of this disclosure, step structures are provided to the fork arms at the ends thereof close to the first drive portion for providing more contact and forcing areas for the first frame to securely sustain thereon the wafer.

Further, in one embodiment of this disclosure, through direct surface contact and vacuuming between the adherence holes and the wafer, the wafer can be then firmly secured, and thus wafer damages from accidental dropping during transportation can be substantially avoided.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A robotic arm configured for picking and placing multi-size wafers, comprising:

a first picking and placing unit, configured for transporting a first-size wafer or a second-size wafer from a first position to a second position, the first picking and placing unit comprising:

a first frame, configured for providing a first spacing and a second spacing to sustain thereon the first-size wafer and the second-size wafer, respectively, the first frame including a pair of fork arms and first adherence holes for vacuuming the first-size wafer or the second-size wafer via air tunnels internal to the pair of fork arms, wherein each fork arm includes an angled portion positioned between a mounting end and a distal end of the fork arm;

a first drive portion connecting to the mounting end of each fork arm, configured for adjusting the first frame to have the first spacing or the second spacing by linearly driving the pair of fork arms to provide the first spacing and the second spacing; and a first link, connected with the first drive portion, configured for providing X-axial and Y-axial displacements;

a second picking and placing unit, identical to and disposed vertically adjacent to the first picking and placing unit, configured for transporting the first-size wafer or the second-size wafer from the first position to the second position, a base, configured for constructing thereon the first picking and placing unit and the second picking and placing unit;

wherein the first picking and placing unit and the second picking and placing unit are vertically arranged in parallel to each other and configured to transport the first-size wafer and the second-size wafer simultaneously.

2. The robotic arm of claim 1, wherein the mounting end and the distal end of each fork arm extend parallel to one another.

3. The robotic arm of claim 2, wherein the linear driving of the pair of fork arms by the first drive portion is perpendicular to an extension direction of the mounting end and the distal end of the pair of fork arms.

4. The robotic arm of claim 1, wherein the angled portion of each fork arm curves inwardly toward the first drive unit.

* * * * *